US012633897B2

(12) United States Patent　　(10) Patent No.: US 12,633,897 B2
Shoda et al.　　(45) Date of Patent: May 19, 2026

(54) ACOUSTIC WAVE DEVICE

(71) Applicant: Murata Manufacturing Co., Ltd., Nagaokakyo (JP)

(72) Inventors: Chihiro Shoda, Nagaokakyo (JP); Yasuaki Shin, Nagaokakyo (JP); Yoshihisa Okano, Nagaokakyo (JP); Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 89 days.

(21) Appl. No.: 18/735,271

(22) Filed: Jun. 6, 2024

(65) Prior Publication Data

US 2024/0322788 A1　　Sep. 26, 2024

Related U.S. Application Data

(63) Continuation of application No. PCT/JP2022/043805, filed on Nov. 28, 2022.

(30) Foreign Application Priority Data

Dec. 15, 2021　(JP) ................................. 2021-203586

(51) Int. Cl.
　　*H03H 9/145* (2006.01)
　　*H03H 9/02* (2006.01)
　　　　(Continued)

(52) U.S. Cl.
　　CPC ........ *H03H 9/145* (2013.01); *H03H 9/02559* (2013.01); *H03H 9/059* (2013.01);
　　　　(Continued)

(58) Field of Classification Search
　　CPC .... H03H 9/145; H03H 9/02559; H03H 9/059; H03H 9/1085; H03H 9/6483;
　　　　(Continued)

(56) References Cited

U.S. PATENT DOCUMENTS 9,799,819 B2 * 10/2017 Shin ....................... H10N 30/88
2006/0132260 A1 6/2006 Iwamoto et al.
(Continued)

FOREIGN PATENT DOCUMENTS

JP　2006180192 A　7/2006
JP　2012253497 A　12/2012
(Continued)

OTHER PUBLICATIONS

International Search Report in PCT/JP2022/043805, mailed Feb. 21, 2023, 3 pages.
Written Opinion in PCT/JP2022/043805, mailed Feb. 21, 2023, 4 pages.

*Primary Examiner* — Jorge L Salazar, Jr.
(74) *Attorney, Agent, or Firm* — Keating & Bennett, LLP

(57) ABSTRACT

An acoustic wave device includes a package substrate including a first main surface, and an acoustic wave element chip on the first main surface and including a piezoelectric layer including second and third main surfaces facing each other, and IDT electrodes at the second main surface on a side of the first main surface. The first main surface includes first and second sides facing each other. The second main surface a first edge portion closer to the first side than the second side, and a second edge portion facing the first edge portion. A first inter-outer peripheral edge distance between the first side and the first edge portion is longer than a second inter-outer peripheral edge distance between the second side and the second edge portion. The piezoelectric layer has a Z-axis defining a crystal axis and inclined with respect to a thickness direction of the piezoelectric layer.

20 Claims, 8 Drawing Sheets

(51) Int. Cl.
    *H03H 9/05*           (2006.01)
    *H03H 9/10*           (2006.01)
    *H03H 9/64*           (2006.01)
    *H03H 9/72*           (2006.01)

(52) U.S. Cl.
    CPC ........ *H03H 9/1085* (2013.01); *H03H 9/6483*
          (2013.01); *H03H 9/725* (2013.01)

(58) Field of Classification Search
    CPC ...... H03H 9/725; H03H 9/02574; H03H 9/25;
                      H03H 9/64; H03H 9/72
    USPC ......................................... 333/133, 193–196
    See application file for complete search history.

(56) References Cited

U.S. PATENT DOCUMENTS

| | | | |
|---|---|---|---|
| 2012/0306591 | A1 | 12/2012 | Nishihara et al. |
| 2015/0372659 | A1 | 12/2015 | Shin et al. |
| 2017/0373670 | A1 | 12/2017 | Ajima |

FOREIGN PATENT DOCUMENTS

| | | | |
|---|---|---|---|
| JP | 2016009874 | A | 1/2016 |
| JP | 2018006799 | A | 1/2018 |
| JP | 2018186481 | A | 11/2018 |

\* cited by examiner

ACOUSTIC WAVE DEVICE

CROSS REFERENCE TO RELATED APPLICATIONS

This application claims the benefit of priority to Japanese Patent Application No. 2021-203586 filed on Dec. 15, 2021 and is a Continuation Application of PCT Application No. PCT/JP2022/043805 filed on Nov. 28, 2022. The entire contents of each application are hereby incorporated herein by reference.

BACKGROUND OF THE INVENTION

1. Field of the Invention

The present invention relates to acoustic wave devices.

2. Description of the Related Art

In the related art, an acoustic wave device is widely used for a filter or the like of a mobile phone. Japanese Unexamined Patent Application Publication No. 2016-009874 discloses an example of an acoustic wave device including a plurality of surface acoustic wave resonators. In the acoustic wave device, a surface acoustic wave chip in which the plurality of surface acoustic wave resonators are provided on a piezoelectric substrate is mounted on a package substrate. The orientation of a crystal Z-axis of the piezoelectric substrate is inclined from the central portion of the package substrate toward an outer side portion as the orientation is directed from the surface of the piezoelectric substrate on the package substrate side to the opposite surface. As a result, the deformation of the piezoelectric substrate due to the temperature change is reduced or prevented.

SUMMARY OF THE INVENTION

When stress is applied to the piezoelectric substrate or a voltage is applied to an interdigital transducer (IDT) electrode of the surface acoustic wave resonator, the polarization inversion may occur in the piezoelectric substrate. When the surface acoustic wave resonator configured on the piezoelectric substrate is affected by the polarization inversion, there is a concern that electrical characteristics of the surface acoustic wave resonator may deteriorate. In the acoustic wave device described in Japanese Unexamined Patent Application Publication No. 2016-009874, it is difficult to sufficiently reduce or prevent the polarization inversion.

Example embodiments of the present invention provide acoustic wave devices each capable of reducing or preventing polarization inversion.

An acoustic wave device according to an example embodiment of the present invention includes a package substrate including a first main surface, and an acoustic wave element chip that is mounted on the first main surface of the package substrate and includes a piezoelectric layer including a second main surface and a third main surface that face each other, and a plurality of IDT electrodes that are provided at the second main surface located on a first main surface side among the second main surface and the third main surface, each IDT electrode including a plurality of electrode fingers. The first main surface of the package substrate includes a first side and a second side that face each other, the second main surface of the piezoelectric layer includes a first edge portion located closer to the first side among the first side and the second side and a second edge portion facing the first edge portion in a plan view, and a distance between the first side and the first edge portion is longer than a distance between the second side and the second edge portion in the plan view. The piezoelectric layer has a Z-axis as a crystal axis, and the Z-axis is inclined with respect to a thickness direction of the piezoelectric layer so as to be directed toward a first edge portion side as the Z-axis is directed from the third main surface toward the second main surface of the piezoelectric layer. When the IDT electrode is viewed from a direction perpendicular to a direction in which the plurality of electrode fingers extend, a region in which the electrode fingers adjacent to each other overlap each other is an intersection region, and a dimension of the intersection region along the direction in which the plurality of electrode fingers extend is an intersection width. When an IDT electrode at a position closest to the first edge portion among the plurality of IDT electrodes is set as an edge-side IDT electrode, a product of the intersection width and a number of pairs of the plurality of electrode fingers of the edge-side IDT electrode is smallest among products of the intersection width and the number of pairs of the plurality of electrode fingers of the plurality of respective IDT electrodes.

An acoustic wave device according to another example embodiment of the present invention includes a package substrate including a first main surface, and an acoustic wave element chip that is mounted on the first main surface of the package substrate and includes a piezoelectric layer including a second main surface and a third main surface that face each other, and a plurality of IDT electrodes that are provided at the second main surface located on a first main surface side among the second main surface and the third main surface, each IDT electrode including a plurality of electrode fingers. A series arm resonator and a plurality of parallel arm resonators, each including the IDT electrode, are provided on the second main surface of the piezoelectric layer. The first main surface of the package substrate includes a first side and a second side that face each other, the second main surface of the piezoelectric layer includes a first edge portion located closer to the first side among the first side and the second side and a second edge portion facing the first edge portion in a plan view, and a distance between the first side and the first edge portion is longer than a distance between the second side and the second edge portion in the plan view. The piezoelectric layer has a Z-axis as a crystal axis, and the Z-axis is inclined with respect to a thickness direction of the piezoelectric layer so as to be directed toward a first edge portion side as the Z-axis is directed from the third main surface toward the second main surface of the piezoelectric layer. When an IDT electrode at a position closest to the first edge portion among the plurality of IDT electrodes is set as an edge-side IDT electrode, the IDT electrode of a parallel arm resonator at a position closest to an input end side among the plurality of parallel arm resonators is the edge-side IDT electrode.

An acoustic wave device according to yet another example embodiment of the present invention includes a first main surface, and an acoustic wave element chip that is mounted on the first main surface of the package substrate and includes a piezoelectric layer including a second main surface and a third main surface that face each other, and a plurality of IDT electrodes that are provided at the second main surface located on a first main surface side among the second main surface and the third main surface, each IDT electrode including a plurality of electrode fingers. A plurality of surface acoustic wave resonators, each including the IDT electrode, are provided on the second main surface of the piezoelectric layer, and the plurality of surface acoustic wave resonators include a series arm resonator and a plurality of parallel arm resonators. The first main surface of the package substrate includes a first side and a second side that face each other, the second main surface of the piezoelectric layer includes a first edge portion located closer to the first side among the first side and the second side and a second edge portion facing the first edge portion in a plan view, and a distance between the first side and the first edge portion is longer than a distance between the second side and the second edge portion in the plan view. The piezoelectric layer has a Z-axis as a crystal axis, and the Z-axis is inclined with respect to a thickness direction of the piezoelectric layer so as to be directed toward a first edge portion side as the Z-axis is directed from the third main surface toward the second main surface of the piezoelectric layer. When the IDT electrode is viewed from a direction perpendicular to a direction in which the plurality of electrode fingers extend, a region in which the electrode fingers adjacent to each other overlap each other is an intersection region, and a dimension of the intersection region along the direction in which the plurality of electrode fingers extend is an intersection width. When an IDT electrode at a position closest to the first edge portion among the plurality of IDT electrodes is set as an edge-side IDT electrode, the IDT electrode of the parallel arm resonator that is not split in series is the edge-side IDT electrode, and a product of the intersection width and a number of pairs of the plurality of electrode fingers of the edge-side IDT electrode is smaller than a product of the intersection width and the number of pairs of the plurality of electrode fingers of the IDT electrode in at least one surface acoustic wave resonator among the surface acoustic wave resonators at a position closest to an input end side.

According to the acoustic wave devices according to example embodiments of the present invention, it is possible to reduce or prevent polarization inversion.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereinafter, the present invention will be elucidated by describing specific example embodiments of the present invention with reference to the drawings.

It should be noted that each example embodiment described in the present specification is an example, and configurations can be partially replaced or combined with each other between different example embodiments.

Figure 1:
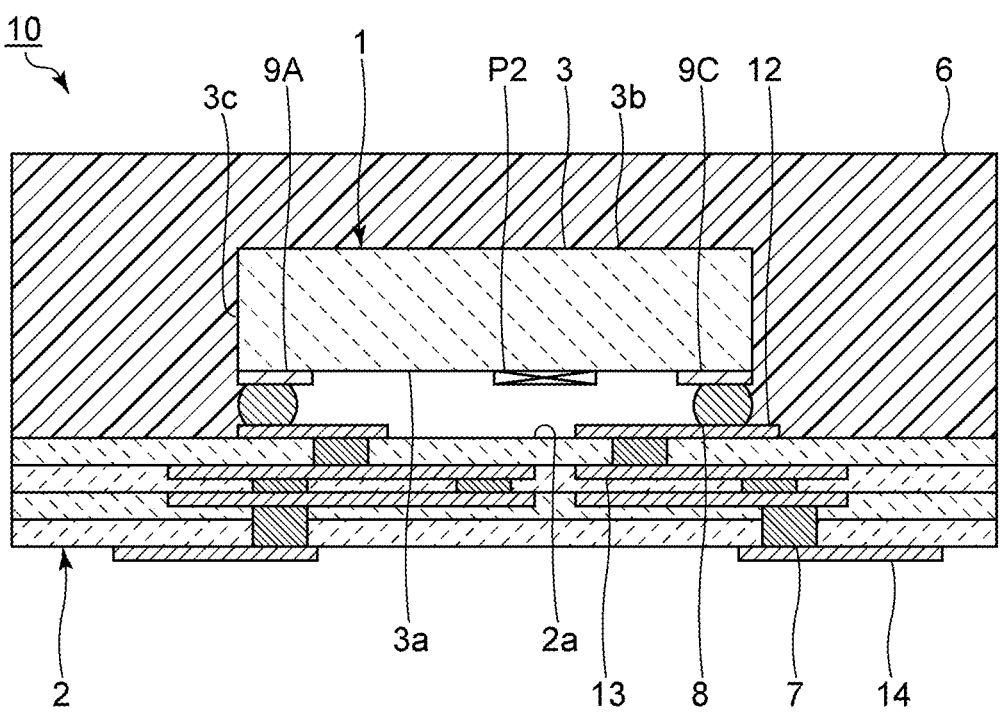
FIG. 1 is a schematic front cross-sectional view of an acoustic wave device according to a first example embodiment of the present invention.

FIG. 1 is a schematic front cross-sectional view of an acoustic wave device according to a first example embodiment of the present invention. In FIG. 1, a surface acoustic wave resonator to be described later is illustrated by a schematic diagram in which two diagonal lines are added to a rectangle.

An acoustic wave device 10 includes an acoustic wave element chip 1 and a package substrate 2. The package substrate 2 has a first main surface 2a. As a material of the package substrate 2, for example, glass epoxy resin, appropriate ceramics, and the like can be used. The acoustic wave element chip 1 is mounted on the first main surface 2*a* of the package substrate 2.

Figure 2:
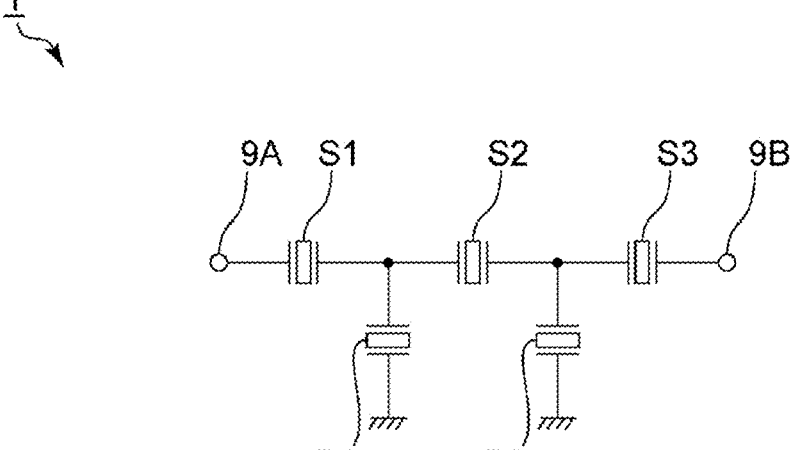
FIG. 2 is a circuit diagram of an acoustic wave element chip in the first example embodiment of the present invention.

FIG. 2 is a circuit diagram of the acoustic wave element chip in the first example embodiment.

The acoustic wave element chip 1 is a ladder filter. The acoustic wave element chip 1 includes an input terminal 9A and an output terminal 9B, a plurality of series arm resonators, and a plurality of parallel arm resonators. More specifically, the plurality of series arm resonators are a series arm resonator S1, a series arm resonator S2, and a series arm resonator S3. The plurality of parallel arm resonators are a parallel arm resonator P1 and a parallel arm resonator P2.

The series arm resonator S1, the series arm resonator S2, and the series arm resonator S3 are connected in series between the input terminal 9A and the output terminal 9B. The parallel arm resonator P1 is connected between a ground potential and a connection point between the series arm resonator S1 and the series arm resonator S2. The parallel arm resonator P2 is connected between the ground potential and a connection point between the series arm resonator S2 and the series arm resonator S3. The circuit configuration of the acoustic wave element chip 1 is not limited to this.

In the acoustic wave element chip 1 of the present example embodiment, all the series arm resonators and all the parallel arm resonators are surface acoustic wave resonators. A specific configuration of the surface acoustic wave resonator will be described below.

Figure 3:
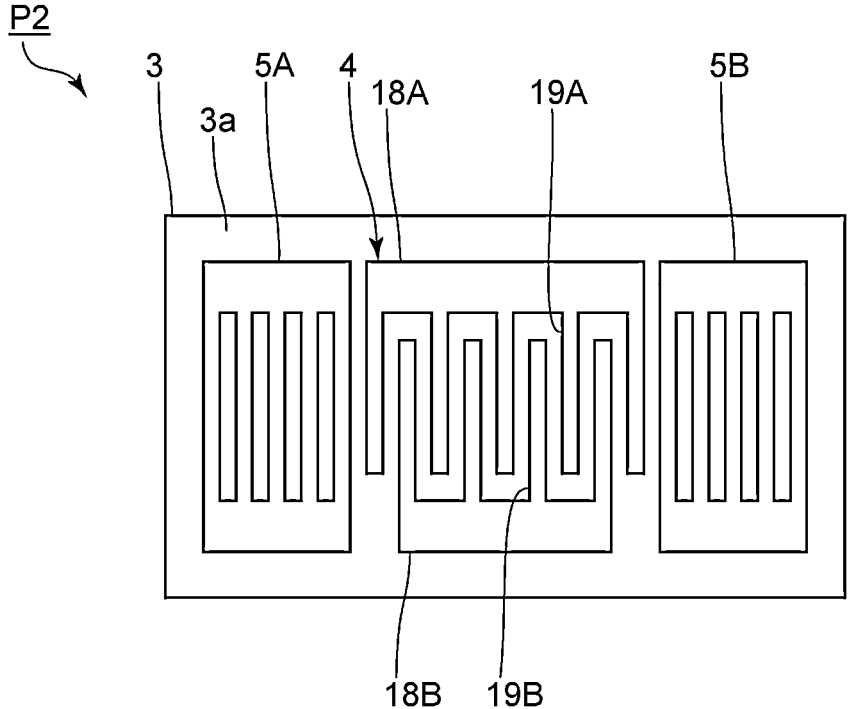
FIG. 3 is a plan view of a parallel arm resonator in the first example embodiment of the present invention.

FIG. 3 is a plan view of the parallel arm resonator in the first example embodiment.

The parallel arm resonator P2 includes a piezoelectric substrate 3 and an IDT electrode 4. The piezoelectric substrate 3 is a substrate formed by only a piezoelectric layer. In a case where the piezoelectric substrate 3 is formed by only the piezoelectric layer, the piezoelectric substrate 3 is assumed to be synonymous with the piezoelectric layer. The piezoelectric substrate 3 may be a laminated substrate including a piezoelectric layer. As the material of the piezoelectric layer, for example, an anisotropic material such as lithium niobate or lithium tantalate is suitably used. Lithium niobate is, for example, LiNbO$_3$, and lithium tantalate is, for example, LiTaO$_3$.

As illustrated in FIG. 1, the piezoelectric substrate 3 has a second main surface 3*a*, a third main surface 3*b*, and a side surface 3*c*. The second main surface 3*a* and the third main surface 3*b* face each other. The side surface 3*c* is connected to the second main surface 3*a* and the third main surface 3*b*.

Returning to FIG. 3, the IDT electrode 4 is provided at the second main surface 3*a* of the piezoelectric substrate 3. By applying an AC voltage to the IDT electrode 4, an acoustic wave is excited. A pair of reflectors 5A and 5B are provided on both sides of the IDT electrode 4 in an acoustic wave propagation direction on the second main surface 3*a*.

The IDT electrode 4 includes a first busbar 18A, a second busbar 18B, a plurality of first electrode fingers 19A, and a plurality of second electrode fingers 19B. The first busbar 18A and the second busbar 18B face each other. One end of each of the plurality of first electrode fingers 19A is connected to the first busbar 18A. One end of each of the plurality of second electrode fingers 19B is connected to the second busbar 18B. The plurality of first electrode fingers 19A and the plurality of second electrode fingers 19B are interdigitated between each other. The plurality of first electrode fingers 19A and the plurality of second electrode fingers 19B may be collectively referred to as electrode fingers below. When a direction in which a plurality of electrode fingers extend is set as an electrode finger extension direction, in the present example embodiment, the electrode finger extension direction is perpendicular to the acoustic wave propagation direction.

The IDT electrode 4, the reflector 5A, and the reflector 5B may be formed by a single-layer metal film or may be formed by a laminated metal film.

Figure 4:
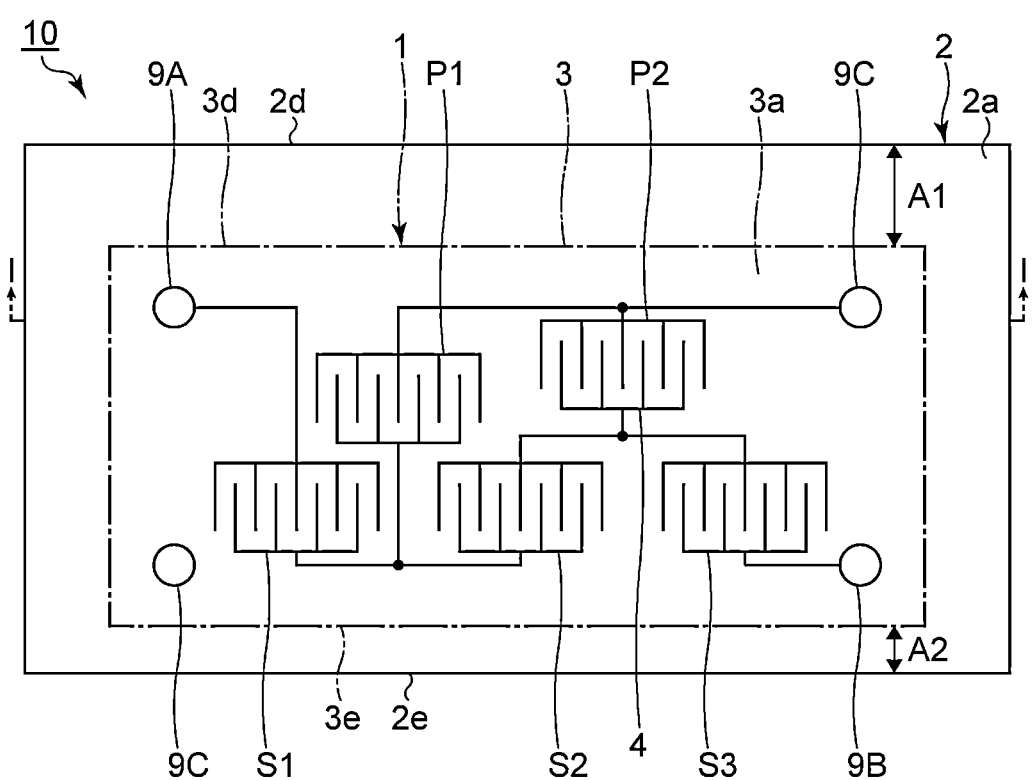
FIG. 4 is a schematic perspective plan view illustrating an electrode structure and the like of the acoustic wave device according to the first example embodiment of the present invention, the electrode structure being provided on a second main surface of a piezoelectric substrate.

FIG. 4 is a schematic perspective plan view illustrating an electrode structure and the like of the acoustic wave device according to the first example embodiment, the electrode structure being provided on the second main surface of the piezoelectric substrate. FIG. 1 is a schematic cross-sectional view taken along I-I line in FIG. 4.

As illustrated in FIG. 4, all surface acoustic wave resonators of the acoustic wave element chip 1 share the piezoelectric substrate 3. Similarly to the parallel arm resonator P2, the plurality of series arm resonators and the parallel arm resonators other than the parallel arm resonator P2 include the IDT electrode and one pair of reflectors. In the present example embodiment, acoustic wave propagation directions of all the surface acoustic wave resonators are parallel to a direction in which a first edge portion 3*d* of the piezoelectric substrate 3 extends. The acoustic wave propagation directions of all the surface acoustic wave resonators are not necessarily parallel to the direction in which the first edge portion 3*d* of the piezoelectric substrate 3 extends.

In the present example embodiment, among a plurality of IDT electrodes of a plurality of surface acoustic wave resonators, the capacitance of the IDT electrode 4 of the parallel arm resonator P2 is the smallest. More specifically, when the IDT electrode is viewed from a direction perpendicular to the electrode finger extension direction, that is, the acoustic wave propagation direction, a region in which the electrode fingers adjacent to each other overlap each other is an intersection region. When the dimension of the intersection region along the electrode finger extension direction is set as an intersection width, the product of the intersection width and the number of pairs of the plurality of electrode fingers of the IDT electrode 4 is the smallest among the plurality of IDT electrodes. That is, when the product of the number of pairs of the plurality of electrode fingers and the intersection width is set as the number of pairs×intersection width, the number of pairs×intersection width of the IDT electrode 4 is the smallest among the number of pairs× intersection width of all IDT electrodes in the acoustic wave element chip 1.

Returning to FIG. 1, the acoustic wave element chip 1 preferably is mounted on the first main surface 2*a* of the package substrate 2 using a flip-chip process, for example. More specifically, among the second main surface 3*a* and the third main surface 3*b* of the piezoelectric substrate 3, the second main surface 3*a* is located on the package substrate 2 side. The second main surface 3*a* is bonded to the first main surface 2*a* by a plurality of bumps 8. As described above, the acoustic wave device 10 has a chip size package (CSP) structure.

As illustrated in FIG. 4, in a plan view, a position of the center of the package substrate 2 and a position of the center of the piezoelectric substrate 3 do not overlap each other. More specifically, in the present example embodiment, in a plan view, the position of the center of the package substrate 2 is different from the position of the center of the piezoelectric substrate 3 in the direction perpendicular to the acoustic wave propagation direction of each surface acoustic wave resonator, that is, in the electrode finger extension direction. In the present specification, the plan view means a view from a direction corresponding to the upper side in FIG. 1 and the like. In FIG. 1, for example, among the piezoelectric substrate 3 side and the package substrate 2 side, the piezoelectric substrate 3 side is the upper side.

The first main surface 2a of the package substrate 2 has a first side 2d and a second side 2e. The first side 2d and the second side 2e face each other. On the other hand, the second main surface 3a of the piezoelectric substrate 3 includes a first edge portion 3d and a second edge portion 3e. The first edge portion 3d and the second edge portion 3e face each other. In the present example embodiment, the first side 2d, the second side 2e, the first edge portion 3d, and the second edge portion 3e extend in parallel with each other. The first side 2d, the second side 2e, the first edge portion 3d, and the second edge portion 3e may extend to be shifted from a direction parallel or substantially parallel to each other.

In a plan view, the first edge portion 3d among the first edge portion 3d and the second edge portion 3e of the piezoelectric substrate 3 is located on the first side 2d side of the package substrate 2. When, in a plan view, a distance between the first side 2d and the first edge portion 3d is set as a first inter-outer peripheral edge distance A1, and a distance between the second side 2e and the second edge portion 3e is set as a second inter-outer peripheral edge distance A2, the first inter-outer peripheral edge distance A1 is longer than the second inter-outer peripheral edge distance A2.

Figure 5:
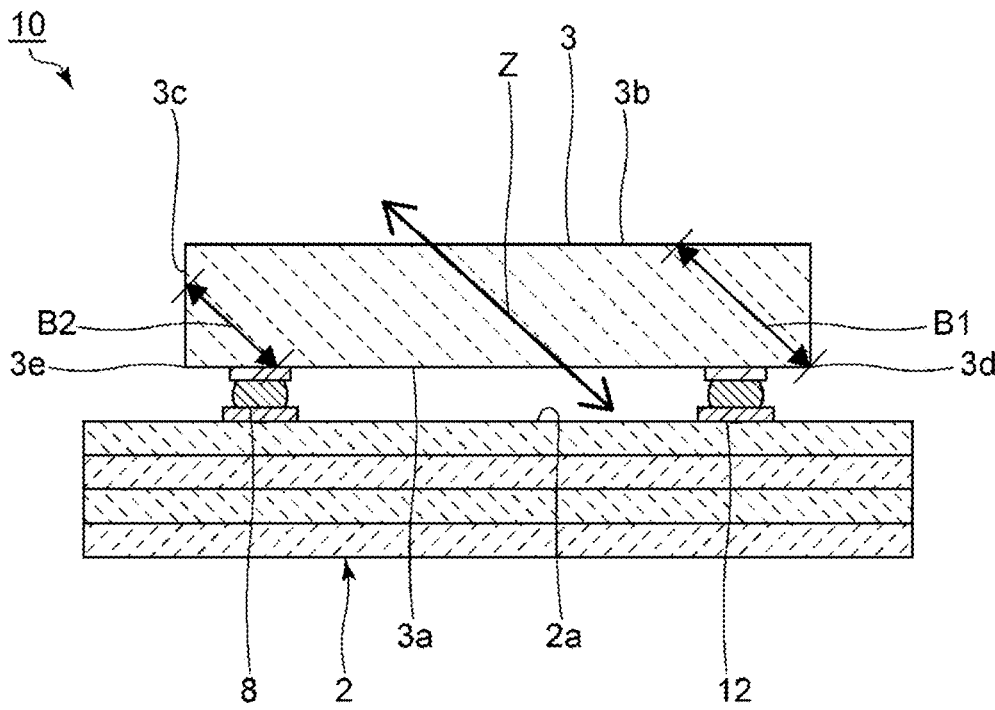
FIG. 5 is a schematic cross-sectional view for describing a direction of a Z-axis in a crystal axis of the piezoelectric substrate in the first example embodiment of the present invention along a direction perpendicular to a direction in which a first edge portion extends.

The piezoelectric substrate 3 has an X-axis, a Y-axis, and a Z-axis as crystal axes. The Z-axis of the piezoelectric substrate 3 is inclined with respect to a thickness direction of the piezoelectric substrate 3. More specifically, as illustrated in FIG. 5, the Z-axis is inclined toward the first edge portion 3d side as the Z-axis is directed from the third main surface 3b of the piezoelectric substrate 3 toward the second main surface 3a. In the present example embodiment, the direction in which the first edge portion 3d extends is perpendicular to the direction of the Z-axis. The acoustic wave propagation directions of all the surface acoustic wave resonators are perpendicular to the direction of the Z-axis. The direction in which the first edge portion 3d extends only needs to intersect the direction of the Z-axis. It is not necessary that the acoustic wave propagation directions of all the surface acoustic wave resonators are perpendicular to the direction of the Z-axis.

Returning to FIG. 4, the input terminal 9A, the output terminal 9B, and a plurality of ground terminals 9C are provided at the second main surface 3a of the piezoelectric substrate 3. The ground terminal 9C is connected to the ground potential. The bump 8 is bonded to each of the above-described terminals. The acoustic wave element chip 1 is electrically connected to the package substrate 2 by a plurality of bumps 8.

Here, among the plurality of IDT electrodes of the plurality of surface acoustic wave resonators, the IDT electrode at the position closest to the first edge portion 3d of the piezoelectric substrate 3 is set to as an edge-side IDT electrode. Some of the unique features of the present example embodiment are as follows. 1) The first inter-outer peripheral edge distance A1 is longer than the second inter-outer peripheral edge distance A2. 2) The Z-axis of the piezoelectric substrate 3 is inclined with respect to the thickness direction of the piezoelectric substrate 3 so as to be directed toward the first edge portion 3d side as the Z-axis is directed from the third main surface 3b of the piezoelectric substrate 3 toward the second main surface 3a. 3) The IDT electrode 4 of the parallel arm resonator P2 is the edge-side IDT electrode, and the number of pairs×intersection width of the edge-side IDT electrode is the smallest among the number of pairs×intersection width of the plurality of respective IDT electrodes. As a result, it is possible to reduce or prevent the polarization inversion. These will be described below.

The polarization inversion may occur when stress is applied to the piezoelectric substrate or a voltage is applied to the IDT electrode. In a case where stress is applied to the piezoelectric substrate, electric charges are generated on the surface of the piezoelectric substrate. Due to the electric charges, a voltage is applied to a portion at which the IDT electrode is provided. When the electric charge is set as Q, the electrostatic capacitance C is set as C, and the voltage is set as V, the higher voltage V is generated as the electrostatic capacitance C becomes smaller, as is clear from Q=CV being the equation of the electrostatic capacitance. As the higher voltage is generated, the polarization inversion is more likely to occur.

In the present example embodiment, as in the configuration of the above 3), the number of pairs×intersection width of the edge-side IDT electrode is the smallest among the number of pairs×intersection width of the plurality of respective IDT electrodes. That is, the electrostatic capacitance of the edge-side IDT electrode is the smallest among the electrostatic capacitances of the plurality of IDT electrodes. In a portion at which the edge-side IDT electrode is provided, many electric charges are unlikely to be generated due to the configurations of the above 1) and 2). The details will be described by using a first reference example and a second reference example as follows. In the first reference example and the second reference example, a package substrate and a piezoelectric substrate are provided, and the type, the number, and the position of elements on the piezoelectric substrate are not particularly limited.

Figure 6:
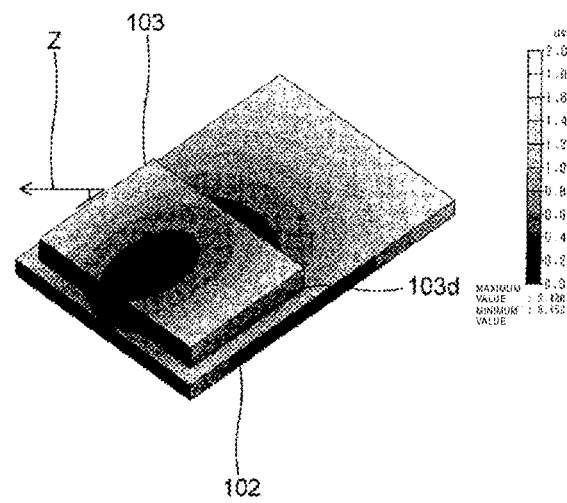
FIG. 6 is a view illustrating a distribution of a displacement amount of an acoustic wave device in a first reference example.
Figure 7:
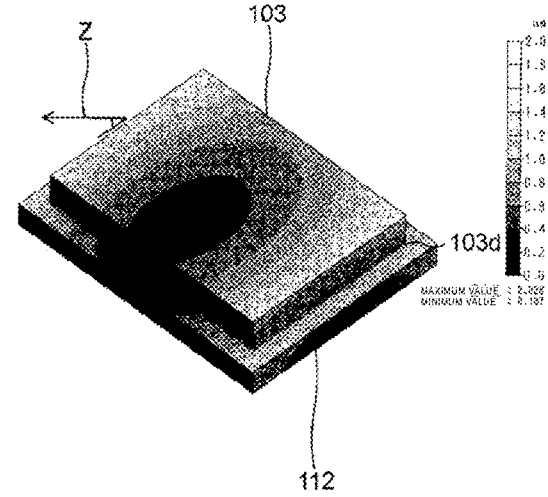
FIG. 7 is a view illustrating a distribution of a displacement amount of an acoustic wave device in a second reference example.

FIG. 6 is a view illustrating a distribution of a displacement amount of an acoustic wave device in the first reference example. FIG. 7 is a view illustrating a distribution of a displacement amount of an acoustic wave device in the second reference example. The distribution of the displacement amount is a result obtained by performing a thermal stress analysis by the finite element method to obtain the displacement amount [μm] in a case where a temperature change of about +100° C. is applied to the acoustic wave device with a room temperature of about 25° C. as a reference, for example.

In the first reference example illustrated in FIG. 6, the center of the package substrate 102 is different from the center of the piezoelectric substrate 103 as in the present example embodiment. In addition, the direction of the Z-axis of the piezoelectric substrate 103 is similar to that in the present example embodiment. That is, the first reference example has the configurations of the above 1) and 2). On the other hand, in the second reference example illustrated in FIG. 7, the direction of the Z-axis of the piezoelectric substrate 103 is the same as that in the present example embodiment, but the center of the package substrate 112 and the center of the piezoelectric substrate 103 coincide with each other. That is, the second reference example has only the configuration of 2) among the configurations of 1) and 2).

As is clear from the comparison between FIGS. 6 and 7, it is understood that the displacement in the first reference example is smaller than that in the second reference example in the vicinity of the first edge portion 103d of the piezoelectric substrate 103 as a whole. As a result, it is understood that, since the acoustic wave device has both the configurations of 1) and 2), the thermal stress applied to the vicinity of the first edge portion 103d of the piezoelectric substrate 103 is reduced, and the displacement in the vicinity of the first edge portion 103d is reduced or prevented.

Returning to FIG. 4, since the present example embodiment has the configurations of the above 1) and 2), it is possible to reduce the thermal stress applied to the vicinity of the first edge portion 3d of the piezoelectric substrate 3 and reduce or prevent the displacement in the vicinity of the first edge portion 3d. As a result, it is possible to reduce the electric charges generated in the vicinity of the first edge portion 3d. Thus, it is possible to reduce electric charges generated in the portion at which the edge-side IDT electrode having the smallest electrostatic capacitance is provided. Accordingly, it is possible to reduce the generated voltage and reduce or prevent the polarization inversion.

In addition, in the present example embodiment, as illustrated in FIG. 5, a dimension B1 of a portion of the piezoelectric substrate 3 including the first edge portion 3d along the Z-axis is larger than a dimension B2 of a portion of the piezoelectric substrate 3 in the vicinity of the second edge portion 3e along the Z-axis. As a result, in the portion at which the edge-side IDT electrode is provided, the electric field resistance increases, and the polarization inversion is much less likely to occur. As described above, it is possible to make it difficult for polarization inversion to occur in the portion where the edge-side IDT electrode that has the smallest electrostatic capacitance and is likely to cause polarization inversion is provided. Therefore, it is possible to effectively reduce or prevent the polarization inversion in the entire acoustic wave device 10.

The second main surface 3a of the piezoelectric substrate 3 may be a positive surface in a polarization axis direction or may be a negative surface. As described above, it is possible to reduce or prevent the thermal stress applied to the vicinity of the first edge portion 3d regardless of whether the second main surface 3a is the positive side or the negative side.

The acoustic wave element chip 1 only needs to include a plurality of surface acoustic wave resonators. The plurality of elastic surface acoustic wave resonators do not necessarily include the series arm resonator and the parallel arm resonator. The number of pairs×intersection width of the edge-side IDT electrode only needs to be the smallest among the number of pairs×intersection width of the plurality of respective IDT electrodes.

A more detailed configuration and a preferred configuration of the present example embodiment will be described below.

As illustrated in FIG. 1, a plurality of mounting terminals 12 are provided at the first main surface 2a of the package substrate 2. The input terminal 9A, the ground terminal 9C, and the output terminal 9B are bonded to the respective mounting terminals 12 by the bumps 8.

The package substrate 2 is a laminated substrate. An internal electrode 13 is provided between each layer. On the other hand, a plurality of external connection terminals 14 are provided at the outermost surface of the package substrate 2 facing the first main surface 2a. Further, a plurality of via electrodes 7 are provided in the package substrate 2. The via electrode 7 penetrates at least one layer of the package substrate 2. The plurality of via electrodes 7 include a via electrode 7 that connects the mounting terminal 12 and the internal electrode 13, a via electrode 7 that connects the internal electrodes 13 to each other, and a via electrode 7 that connects the internal electrode 13 and the external connection terminal 14 to each other. The package substrate 2 illustrated in FIG. 1 is an example, and the configuration of the package substrate 2 is not limited to this.

The plurality of bumps 8 are preferably Au bumps. As a result, it is possible to reduce the height in the acoustic wave device 10.

In the present example embodiment, a sealing resin layer 6 is provided at the package substrate 2 to cover the acoustic wave element chip 1. As a result, the acoustic wave element chip 1 is protected, and it is possible to reduce or prevent the breakage of the acoustic wave element chip 1.

Further, it is possible to reduce or prevent the displacement of the package substrate 2 by providing the sealing resin layer 6. In addition, as illustrated in FIG. 4, in the present example embodiment, the first inter-outer peripheral edge distance A1 is longer than the second inter-outer peripheral edge distance A2. Therefore, in a plan view, in a portion between the first side 2d of the package substrate 2 and the first edge portion 3d of the piezoelectric substrate 3, it is possible to increase an area of the portion covered with the sealing resin layer 6. As a result, it is possible to effectively increase the strength of the portion of the piezoelectric substrate 3 located in the vicinity of the first edge portion 3d of the package substrate 2 with respect to an external force. Therefore, even when an external force is applied to the package substrate 2, it is possible to reduce or prevent the stress applied to the vicinity of the first edge portion 3d of the piezoelectric substrate 3. Thus, it is possible to effectively reduce or prevent the polarization inversion in the portion at which the edge-side IDT electrode in which the polarization inversion is likely to occur is provided. Therefore, it is possible to effectively reduce or prevent the polarization inversion in the entire acoustic wave device 10.

In the present example embodiment, the sealing resin layer 6 covers the side surface 3c and the third main surface 3b of the piezoelectric substrate 3. The sealing resin layer 6 only needs to be provided to cover at least the side surface 3c of the piezoelectric substrate 3.

Figure 8:
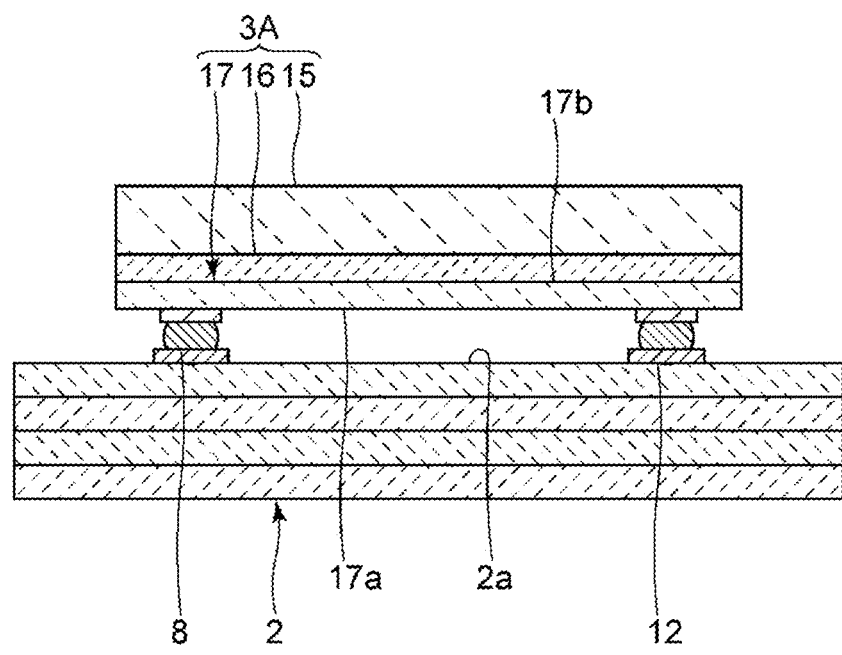
FIG. 8 is a schematic cross-sectional view for describing a configuration of a piezoelectric substrate in a modification example of the first example embodiment of the present invention along a direction perpendicular to a direction in which a first edge portion extends.

As described above, the piezoelectric substrate may be a laminated substrate including a piezoelectric layer. For example, a piezoelectric substrate 3A in a modification example of the first example embodiment illustrated in FIG. 8 includes a support substrate 15, an intermediate layer 16, and a piezoelectric layer 17. The support substrate 15, the intermediate layer 16, and the piezoelectric layer 17 are laminated in this order. The piezoelectric layer 17 has a second main surface 17a and a third main surface 17b. Among the second main surface 17a and the third main surface 17b of the piezoelectric layer 17, the third main surface 17b is located on the support substrate 15 side. Each surface acoustic wave resonator is provided at the second main surface 17a.

The intermediate layer 16 is formed by an appropriate dielectric film. The intermediate layer 16 is not limited to a single-layer dielectric film and may be formed by a laminate of a plurality of dielectric films. As a material of the support substrate 15, for example, a semiconductor such as silicon or an appropriate ceramic can be used. The piezoelectric substrate 3A may be a laminated substrate of the support substrate 15 and the piezoelectric layer 17.

The configuration in which the piezoelectric substrate is a laminated substrate can be applied to a configuration of an example embodiment of the present invention other than the first example embodiment.

In the first example embodiment, as an example of the portion at which the polarization inversion is likely to occur, the portion at which the IDT electrode having the smallest number of pairs×intersection width is provided in the piezoelectric substrate has been described. In an example embodiment of the present invention, even in a case where the IDT electrode other than the above-described IDT electrode is the edge-side IDT electrode, it is possible to effectively reduce or prevent the polarization inversion in the entire acoustic wave device. This example is shown below.

Figure 9:
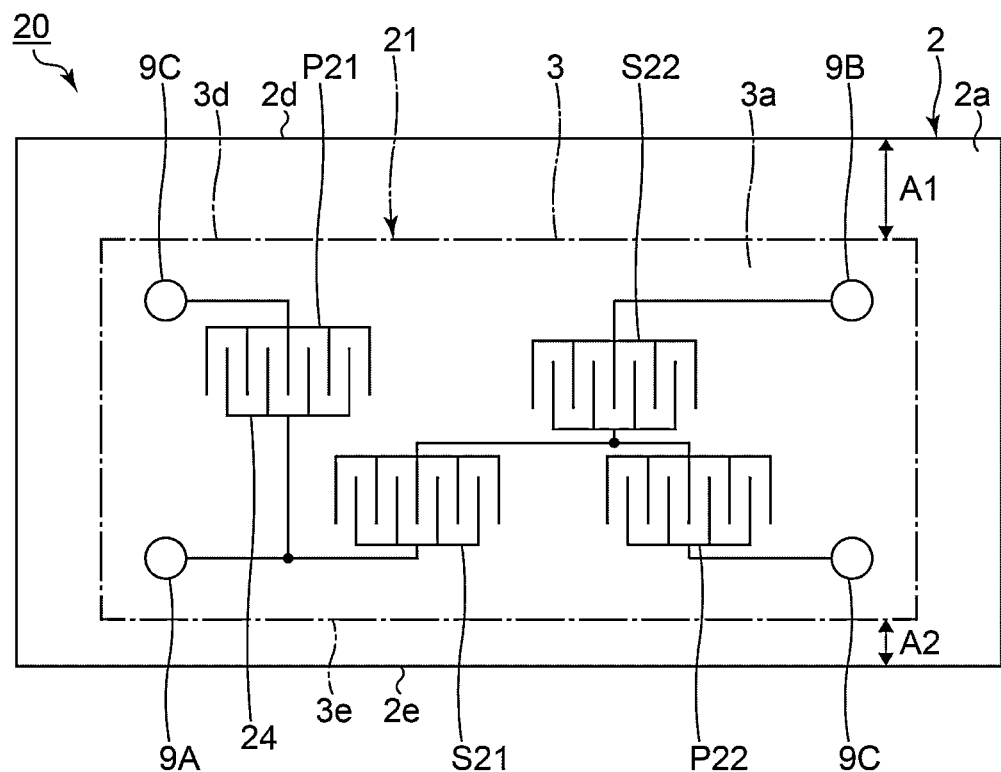
FIG. 9 is a schematic perspective plan view illustrating an electrode structure and the like of an acoustic wave device according to a second example embodiment of the present invention, the electrode structure being provided on a second main surface of a piezoelectric substrate.

FIG. 9 is a schematic perspective plan view illustrating an electrode structure and the like of an acoustic wave device according to a second example embodiment, the electrode structure being provided on a second main surface of a piezoelectric substrate.

The present example embodiment is different from the first example embodiment in that the IDT electrode of a parallel arm resonator located at the position closest to an input end side among the plurality of parallel arm resonators is the edge-side IDT electrode. Further, the present example embodiment is different from the first example embodiment in the circuit configuration. An acoustic wave device 20 in the present example embodiment has the similar configuration to the configuration of the acoustic wave device 10 in the first example embodiment except for the above point.

An acoustic wave element chip 21 in the present example embodiment is a ladder filter. The acoustic wave element chip 21 includes an input terminal 9A, an output terminal 9B, a plurality of ground terminals 9C, a plurality of series arm resonators, and a plurality of parallel arm resonators. More specifically, the plurality of series arm resonators are a series arm resonator S21 and a series arm resonator S22. The plurality of parallel arm resonators are a parallel arm resonator P21 and a parallel arm resonator P22.

The series arm resonator S21 and the series arm resonator S22 are connected in series to each other between the input terminal 9A and the output terminal 9B. The parallel arm resonator P21 is connected between the input terminal 9A and the ground terminal 9C. The parallel arm resonator P22 is connected between the ground terminal 9C and a connection point between the series arm resonator S21 and the series arm resonator S22. The circuit configuration of the acoustic wave element chip 21 is not limited to this.

In the present example embodiment, the parallel arm resonator located closest to the input end side, that is, the input terminal 9A side among the plurality of parallel arm resonators is the parallel arm resonator P21. More specifically, the parallel arm resonator P21 is connected to the input terminal 9A without being interposed between any of the series arm resonators. As illustrated in FIG. 9, the IDT electrode 24 of the parallel arm resonator P21 is the edge-side IDT electrode.

The hot potential to which one busbar of the IDT electrode in the parallel arm resonator at the position closest to the input end side is connected is the highest among the hot potentials to which the plurality of parallel arm resonators are connected. In the present specification, the hot potential refers to a signal potential. Further, the other busbar is connected to the ground potential. As a result, the voltage applied to the IDT electrode in the parallel arm resonator at the position closest to the input end side is large. Therefore, polarization inversion is likely to occur in a portion of the piezoelectric substrate at which the IDT electrode is provided.

Regarding this, the present example embodiment has the configurations of the above 1) and the above 2) as in the first example embodiment. Specifically, the first inter-outer peripheral edge distance A1 is longer than the second inter-outer peripheral edge distance A2. Further, the Z-axis of the piezoelectric substrate 3 is inclined with respect to the thickness direction of the piezoelectric substrate 3 to be directed toward the first edge portion 3d side as the Z-axis of the piezoelectric substrate 3 is directed from the third main surface 3b of the piezoelectric substrate 3 toward the second main surface 3a. In addition to this, the IDT electrode 24 is the edge-side IDT electrode. As a result, it is possible to effectively make it difficult to cause the polarization inversion in the portion at which the edge-side IDT electrode in which the polarization inversion is likely to occur is provided. Accordingly, it is possible to effectively reduce or prevent the polarization inversion in the entire acoustic wave device 20.

It is preferable that the parallel arm resonator P21 is connected to the input terminal 9A without interposing the series arm resonator. In this case, the voltage applied to the edge-side IDT electrode, which is the IDT electrode 24 of the parallel arm resonator P21, is particularly high. As a result, example embodiments of the present invention are particularly suitable. The parallel arm resonator P21 may be connected to the input terminal 9A through the series arm resonator.

In the first example embodiment and the second example embodiment, the piezoelectric substrate 3 and the package substrate 2 have a rectangular or substantially rectangular shape in a plan view. The first edge portion 3d and the second edge portion 3e of the piezoelectric substrate 3 correspond to a long side in a rectangle. The first edge portion 3d and the second edge portion 3e may correspond to a short side in a rectangle. On the other hand, the first side 2d and the second side 2e of the package substrate 2 are long sides in a rectangle. The first side 2d and the second side 2e may be the short sides in the rectangle.

Figure 10:
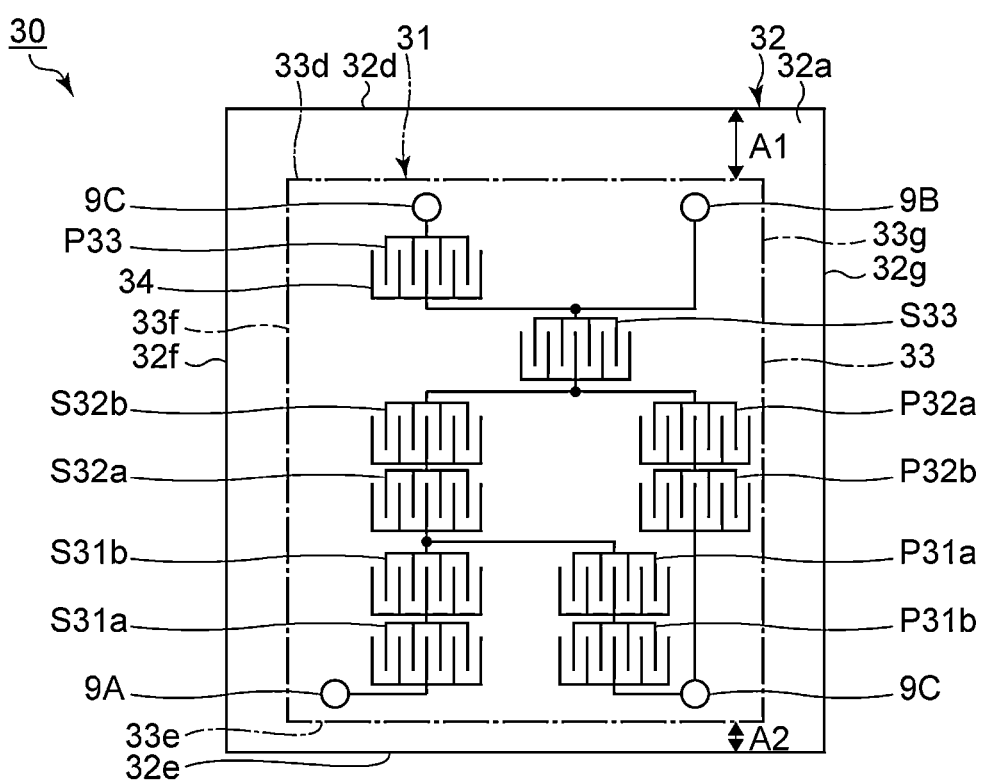
FIG. 10 is a schematic perspective plan view illustrating an electrode structure and the like of an acoustic wave device according to a third example embodiment of the present invention, the electrode structure being provided on a second main surface of a piezoelectric substrate.

FIG. 10 is a schematic perspective plan view illustrating an electrode structure and the like of an acoustic wave device according to a third example embodiment, the electrode structure being provided on a second main surface of a piezoelectric substrate.

The present example embodiment is different from the first example embodiment in the length of each edge portion of a piezoelectric substrate 33, the length of each side of a package substrate 32, and the circuit configuration. The present example embodiment is different from the first example embodiment in that the number of pairs×intersection width of the edge-side IDT electrode is not limited to being the smallest among the number of pairs×intersection width of the plurality of respective IDT electrodes. In the present example embodiment, the number of pairs×intersection width of the edge-side IDT electrode is smaller than the number of pairs×intersection width of the IDT electrode in the surface acoustic wave resonator located at the position closest to the input end side. An acoustic wave device 30 in the present example embodiment has the similar configuration to the configuration of the acoustic wave device 10 in the first example embodiment except for the above point.

The piezoelectric substrate 33 in the present example embodiment includes a first edge portion 33d, a second edge portion 33e, a third edge portion 33f, and a fourth edge portion 33g. The third edge portion 33f and the fourth edge portion 33g are connected to the first edge portion 33d and the second edge portion 33e. The third edge portion 33f and the fourth edge portion 33g face each other. The lengths of the first edge portion 33d and the second edge portion 33e are shorter than the lengths of the third edge portion 33f and the fourth edge portion 33g. The lengths of the first edge portion 33d and the second edge portion 33e may be longer than the lengths of the third edge portion 33f and the fourth edge portion 33g.

The package substrate 32 has a first side 32d, a second side 32e, a third side 32f, and a fourth side 32g. The third side 32*f* and the fourth side 32*g* are connected to the first side 32*d* and the second side 32*e*. The third side 32*f* and the fourth side 32*g* face each other. The lengths of the first side 32*d* and the second side 32*e* are shorter than the lengths of the third side 32*f* and the fourth side 32*g*. The lengths of the first side 32*d* and the second side 32*e* may be longer than the lengths of the third side 32*f* and the fourth side 32*g*.

An acoustic wave element chip 31 in the present example embodiment is a ladder filter. The acoustic wave element chip 31 includes an input terminal 9A, an output terminal 9B, a plurality of ground terminals 9C, a plurality of series arm resonators, and a plurality of parallel arm resonators. More specifically, the plurality of series arm resonators are a series arm resonator S31*a*, a series arm resonator S31*b*, a series arm resonator S32*a*, a series arm resonator S32*b*, and a series arm resonator S33. The plurality of parallel arm resonators are a parallel arm resonator P31*a*, a parallel arm resonator P31*b*, a parallel arm resonator P32*a*, a parallel arm resonator P32*b*, and a parallel arm resonator P33.

The series arm resonator S31*a*, the series arm resonator S31*b*, the series arm resonator S32*a*, the series arm resonator S32*b*, and the series arm resonator S33 are connected in series between the input terminal 9A and the output terminal 9B. The series arm resonator S31*a* and the series arm resonator S31*b* are split resonators in which one series arm resonator is split in series. Similarly, the series arm resonator S32*a* and the series arm resonator S32*b* are also split resonators in which one series arm resonator is split in series.

The parallel arm resonator P31*b* and the parallel arm resonator P31*a* are connected in series to each other between a connection point between the series arm resonator S31*b* and the series arm resonator S32*a* and the ground terminal 9C. The parallel arm resonator P32*b* and the parallel arm resonator P32*a* are connected in series to each other between a connection point between the series arm resonator S32*b* and the series arm resonator S33 and the ground terminal 9C. The parallel arm resonator P33 is connected between the output terminal 9B and the ground terminal 9C. The parallel arm resonator P31*a* and the parallel arm resonator P31*b* are split resonator in which one parallel arm resonator is split in series. Similarly, the parallel arm resonator P32*a* and the parallel arm resonator P32*b* are also split resonators in which one parallel arm resonator is split in series. On the other hand, the parallel arm resonator P33 is not a split resonator. The circuit configuration of the acoustic wave element chip 31 is not limited to this.

As illustrated in FIG. 10, in the present example embodiment, the IDT electrode 34 of the parallel arm resonator P33 is the edge-side IDT electrode. The surface acoustic wave resonator that is located at the position closest to the input end side, that is, closest to the input terminal 9A side is the series arm resonator S31*a*. The number of pairs×intersection width of the edge-side IDT electrode is smaller than the number of pairs×intersection width of the IDT electrode of the series arm resonator S31*a*.

In the split resonator in which the resonator is split in series, the applied voltage can be reduced. Therefore, the polarization inversion is less likely to occur in a portion where the split resonator is configured. In the ladder filter, not all the resonators are split in series. In addition, in a portion at which the IDT electrode of a resonator that is not split in series is provided, the polarization inversion is likely to occur as compared with a portion where the IDT electrode of the split resonator is provided. Further, as described above, since the electrostatic capacitance of the IDT electrode having a small number of pairs×intersection width is small, the polarization inversion is likely to occur in a portion where such an IDT electrode is provided. In addition, since the parallel arm resonator is connected to the hot potential and the ground potential, the voltage to be applied is large. Therefore, the polarization inversion is likely to occur in a portion where the IDT electrode of the parallel arm resonator is provided. All of these conditions under which the polarization inversion is likely to occur correspond to a portion of the piezoelectric substrate 33 at which the IDT electrode 34 is provided.

Regarding this, the present example embodiment has the configurations of the above 1) and the above 2) as in the first example embodiment. Specifically, the first inter-outer peripheral edge distance A1 is longer than the second inter-outer peripheral edge distance A2. Further, the Z-axis of the piezoelectric substrate 33 is inclined with respect to the thickness direction of the piezoelectric substrate 33 to be directed toward the first edge portion 33*d* side as the Z-axis of the piezoelectric substrate 33 is directed from the third main surface of the piezoelectric substrate 33 toward the second main surface. In addition to this, the IDT electrode 34 is the edge-side IDT electrode. As a result, it is possible to effectively make it difficult to cause the polarization inversion in the portion at which the edge-side IDT electrode in which the polarization inversion is likely to occur is provided. Accordingly, it is possible to effectively reduce or prevent the polarization inversion in the entire acoustic wave device 30.

In the present example embodiment, the surface acoustic wave resonator located at the position closest to the input end side is only the series arm resonator S31*a*. For example, the surface acoustic wave resonator located at the position closest to the input end side may be two surface acoustic wave resonators of the series arm resonator and the parallel arm resonator. In this case, the number of pairs×intersection width of the edge-side IDT electrode only needs to be smaller than the number of pairs×intersection width of the IDT electrode in at least one surface acoustic wave resonator among the surface acoustic wave resonators located at the position closest to the input end side.

Figure 11:
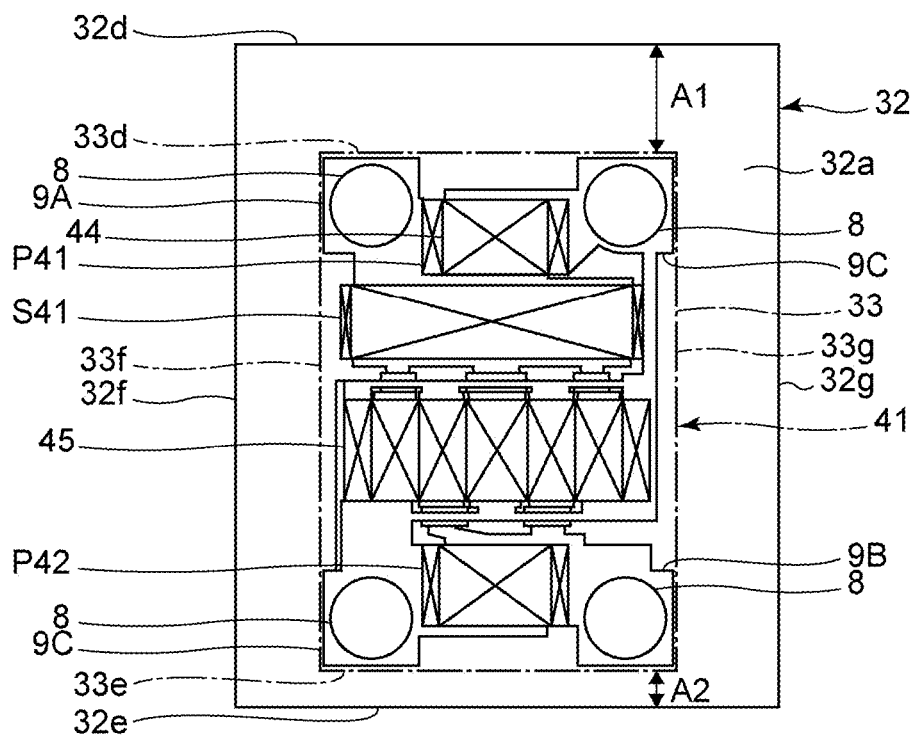
FIG. 11 is a schematic perspective plan view illustrating an electrode structure and the like of an acoustic wave device according to a fourth example embodiment of the present invention, the electrode structure being provided on a second main surface of a piezoelectric substrate.

FIG. 11 is a schematic perspective plan view illustrating an electrode structure and the like of an acoustic wave device according to a fourth example embodiment, the electrode structure being provided on a second main surface of a piezoelectric substrate. In FIG. 11, an IDT electrode and a reflector are illustrated by a schematic diagram in which two diagonal lines are added to a rectangle.

The present example embodiment is different from the first example embodiment in the arrangement of a plurality of bumps 8 and the circuit configuration, and in that a piezoelectric substrate 33 and a package substrate 32 are similar to those in the third example embodiment. An acoustic wave device in the present example embodiment has the similar configuration to the configuration of the acoustic wave device 10 in the first example embodiment except for the above point. The number of pairs×intersection width of the edge-side IDT electrode in the present example embodiment is the smallest among the number of pairs× intersection width of the plurality of IDT electrodes in the acoustic wave element chip 41.

As illustrated in FIG. 11, a plurality of bumps 8 are disposed along each of the first edge portion 33*d*, the second edge portion 33*e*, the third edge portion 33*f*, and the fourth edge portion 33*g* of the piezoelectric substrate 33. It is assumed that the bump 8 provided in the vicinity of a portion at which the two edge portions intersect each other is disposed along both of the two edge portions. As a result, in the present example embodiment, two bumps 8 are disposed along each of the edge portions.

A pitch between a plurality of bumps 8 disposed along the first edge portion 33*d* is shorter than a pitch between a plurality of bumps 8 disposed along the third edge portion 33*f* and the fourth edge portion 33*g*. The IDT electrode 44, which is the edge-side IDT electrode, is disposed to be sandwiched between two bumps 8 among the plurality of bumps 8 disposed along the first edge portion 33*d* of the piezoelectric substrate 33. Since the edge-side IDT electrode is sandwiched between the two bumps 8 and the pitch between the bumps 8 is short, it is possible to effectively reduce or prevent the displacement of the portion of the piezoelectric substrate 33 at which the edge-side IDT electrode is provided.

In addition, it is possible to further reduce or prevent the displacement of the portion at which the edge-side IDT electrode is provided, with the same configuration as that of the first example embodiment, that is, the configurations of the above 1) and 2). As a result, it is possible to further reduce or prevent the polarization inversion in the portion at which the edge-side IDT electrode in which the polarization inversion is likely to occur is provided. Accordingly, it is possible to further reduce or prevent the polarization inversion in the entire acoustic wave device.

At least a portion of the edge-side IDT electrode only needs to be disposed to be sandwiched by the two bumps 8. The circuit configuration of the present example embodiment will be described below.

Figure 12:
FIG. 12 is a circuit diagram of an acoustic wave element chip in the fourth example embodiment of the present invention.
Figure 12:
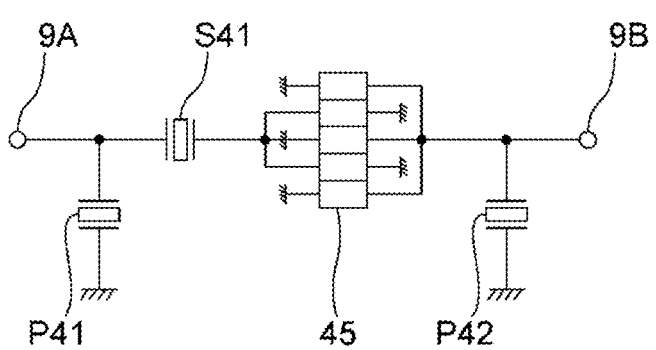

FIG. 12 is a circuit diagram of the acoustic wave element chip in the fourth example embodiment.

An acoustic wave element chip 41 includes an input terminal 9A, an output terminal 9B, a longitudinally coupled resonator-type acoustic wave filter 45, a series arm resonator S41, and a plurality of parallel arm resonators. More specifically, the plurality of parallel arm resonators are a parallel arm resonator P41 and a parallel arm resonator P42. In the present example embodiment, the series arm resonator S41 is used as a series-connected trap. The parallel arm resonator P41 and the parallel arm resonator P42 are used as parallel-connected traps.

The longitudinally coupled resonator-type acoustic wave filter 45 is a 5IDT type. The number of IDT electrodes of the longitudinally coupled resonator-type acoustic wave filter 45 is not limited to 5. The longitudinally coupled resonator-type acoustic wave filter 45 may be, for example, a 3IDT type or a 7IDT type.

The longitudinally coupled resonator-type acoustic wave filter 45 is connected between the input terminal 9A and the output terminal 9B. The series arm resonator S41 is connected between the input terminal 9A and the longitudinally coupled resonator-type acoustic wave filter 45. The parallel arm resonator P41 is connected between the input terminal 9A and the ground potential. The parallel arm resonator P42 is connected between the output terminal 9B and the ground potential. In the present example embodiment, as illustrated in FIG. 11, the IDT electrode 44 of the parallel arm resonator P41 is the edge-side IDT electrode. The circuit configuration of the acoustic wave element chip 41 is not limited to this.

As in the present example embodiment, the configuration in which at least a portion of the edge-side IDT electrode is sandwiched between the bumps having a short pitch can be applied to a configuration of an example embodiment of the present invention other than the present example embodiment.

In the first to fourth example embodiments, the acoustic wave element chip is a band-pass filter. The acoustic wave element chip may be a duplexer, a multiplexer, or the like. Alternatively, a plurality of element chips that are band-pass filters may be mounted on a package substrate. As a result, the acoustic wave device may be configured as a duplexer, a multiplexer, or the like as a whole. This example is shown below.

Figure 13:
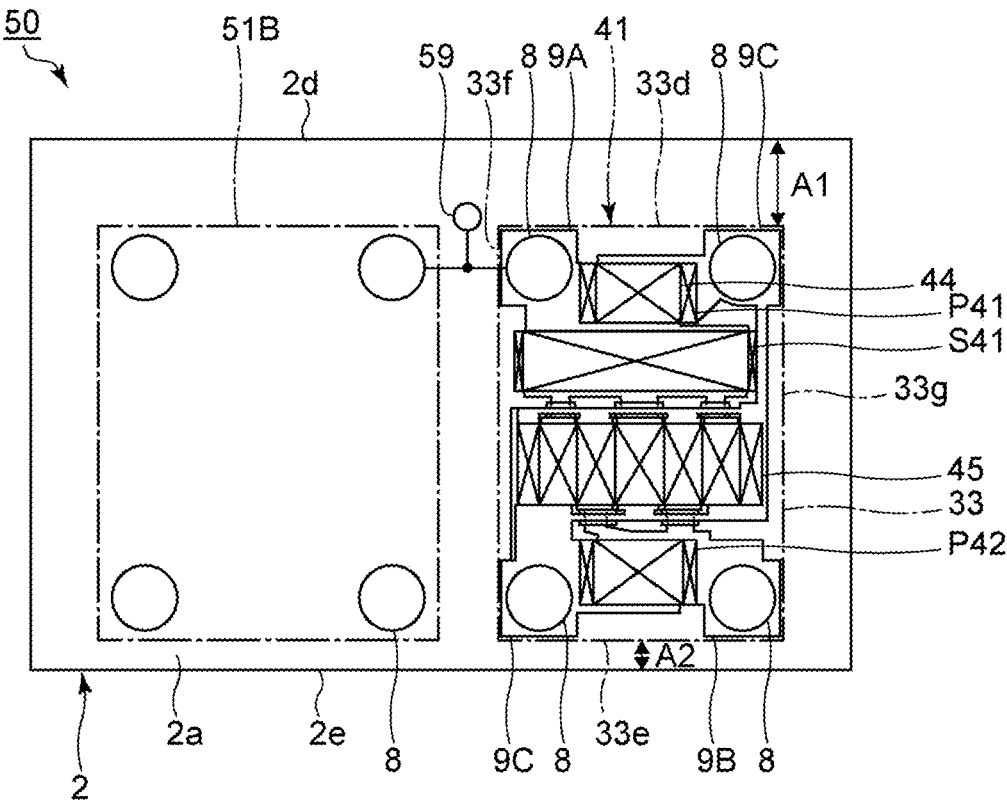
FIG. 13 is a schematic perspective plan view illustrating an electrode structure and the like of an acoustic wave device according to a fifth example embodiment of the present invention, the electrode structure being provided on a second main surface of a piezoelectric substrate.

FIG. 13 is a schematic perspective plan view illustrating an electrode structure and the like of an acoustic wave device according to a fifth example embodiment, the electrode structure being provided on a second main surface of a piezoelectric substrate. In FIG. 13, the electrode structure in an element chip 51B, which will be described later, is omitted.

An acoustic wave device 50 in the present example embodiment is a duplexer. More specifically, in the acoustic wave device 50, two element chips are mounted on the first main surface 2*a* of the package substrate 2. One element chip is an acoustic wave element chip 41 having the similar configuration to that of the fourth example embodiment. The acoustic wave element chip 41 is a reception filter. The other element chip 51B also has the configuration of an acoustic wave element chip according to an example embodiment of the present invention. The element chip 51B is a transmission filter.

The acoustic wave element chip 41 and the element chip 51B are commonly connected to a common connection terminal 59 schematically illustrated in FIG. 13. In the present example embodiment, the common connection terminal 59 is an antenna terminal. The antenna terminal is connected to an antenna.

As illustrated in FIG. 13, in the present example embodiment, the first inter-outer peripheral edge distance A1 is longer than the second inter-outer peripheral edge distance A2. Further, the acoustic wave element chip 41 has the configurations of the above 2) and 3). The same applies to the element chip 51B. Thus, it is possible to effectively reduce or prevent the polarization inversion in the entire acoustic wave device 50.

The element chip 51B does not need to be an acoustic wave element chip according to an example embodiment of the present invention. In a case where a plurality of element chips are mounted on the package substrate 2 as in the acoustic wave device 50, at least one of the plurality of element chips preferably is an acoustic wave element chip according to an example embodiment of the present invention.

Also, in sixth to eighth example embodiments below, an example in which a plurality of element chips are mounted on a package substrate is shown. Also, in the sixth to eighth example embodiments, it is possible to effectively reduce or prevent the polarization inversion in the entire acoustic wave device as in the fifth example embodiment.

Figure 14:
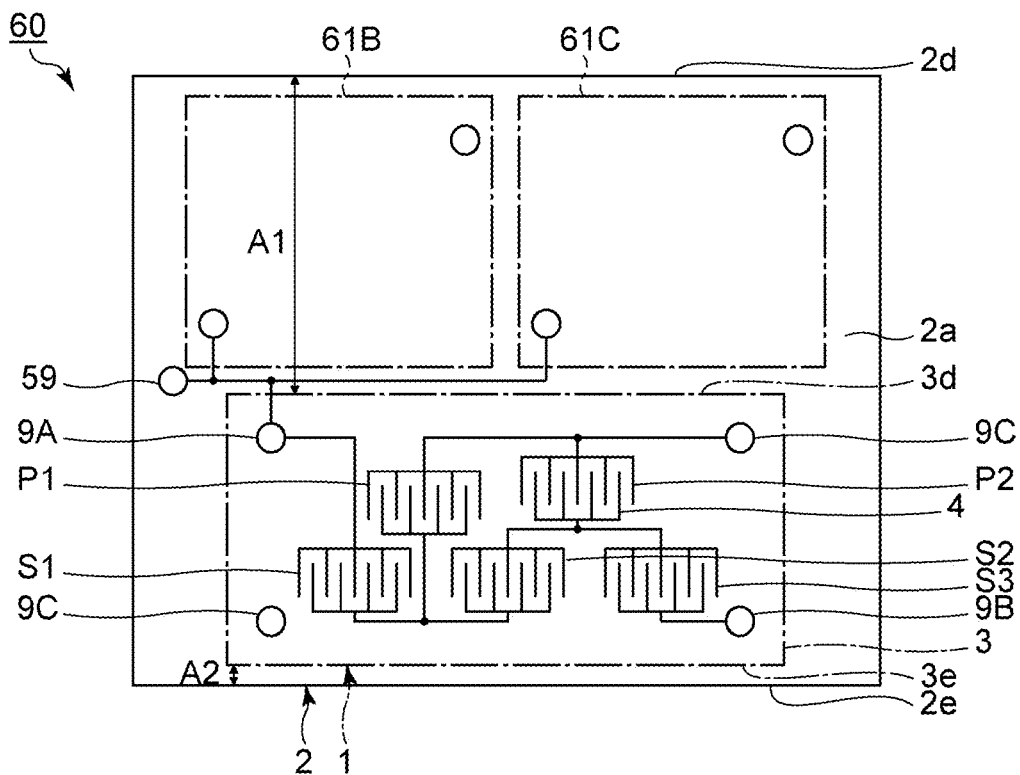
FIG. 14 is a schematic perspective plan view illustrating an electrode structure and the like of an acoustic wave device according to a sixth example embodiment of the present invention, the electrode structure being provided on a second main surface of a piezoelectric substrate.

FIG. 14 is a schematic perspective plan view illustrating an electrode structure and the like of an acoustic wave device according to the sixth example embodiment, the electrode structure being provided on a second main surface of a piezoelectric substrate. In FIG. 14, the electrode structure other than the input terminal and the output terminal in an element chip 61B and an element chip 61C, which will be described later, is omitted.

An acoustic wave device 60 according to an example embodiment of the present example embodiment is a multiplexer. More specifically, in the acoustic wave device 60, three element chips are mounted on the first main surface 2*a* of the package substrate 2. Specifically, the three element chips are an acoustic wave element chip 1, an element chip 61B, and an element chip 61C. The acoustic wave element chip 1 has the similar configuration to that in the first example embodiment. The number of element chips of the acoustic wave device 60 is not limited to three. The acoustic wave device 60 may include four or more element chips. The acoustic wave element chip 1, the element chip 61B, and the element chip 61C are commonly connected to the common connection terminal 59.

In the acoustic wave device 60, the first inter-outer peripheral edge distance A1 includes, in a plan view, a dimension of a portion at which the element chip 61B or the element chip 61C other than the acoustic wave element chip 1 is provided. The same applies to the seventh example embodiment and the eighth example embodiment.

Figure 15:
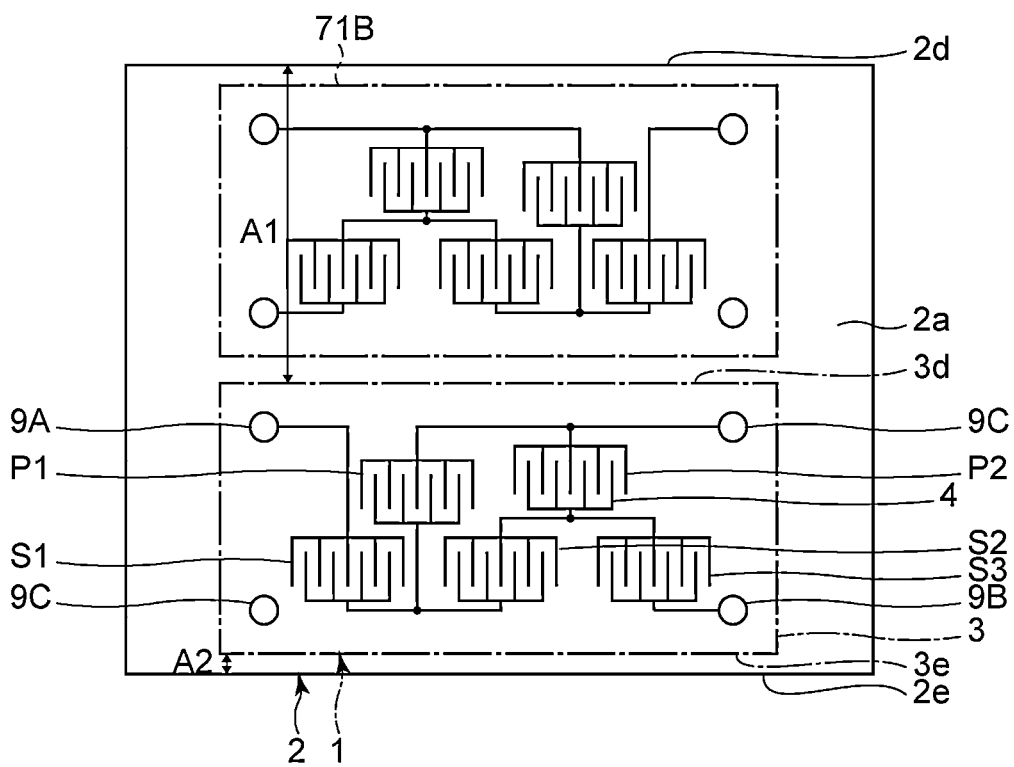
FIG. 15 is a schematic perspective plan view illustrating an electrode structure and the like of an acoustic wave device according to a seventh example embodiment of the present invention, the electrode structure being provided on a second main surface of a piezoelectric substrate.

FIG. 15 is a schematic perspective plan view illustrating an electrode structure and the like of an acoustic wave device according to the seventh example embodiment, the electrode structure being provided on a second main surface of a piezoelectric substrate.

The acoustic wave device in the present example embodiment includes an acoustic wave element chip 1 and an element chip 71B. Specifically, the acoustic wave element chip 1 having the similar configuration to that in the first example embodiment is mounted on the first main surface 2a of the package substrate 2. Further, the element chip 71B is mounted on the first main surface 2a. The acoustic wave element chip 1 and the element chip 71B are not electrically connected to each other. The acoustic wave element chip 1 and the element chip 71B are elements independent of each other.

Figure 16:
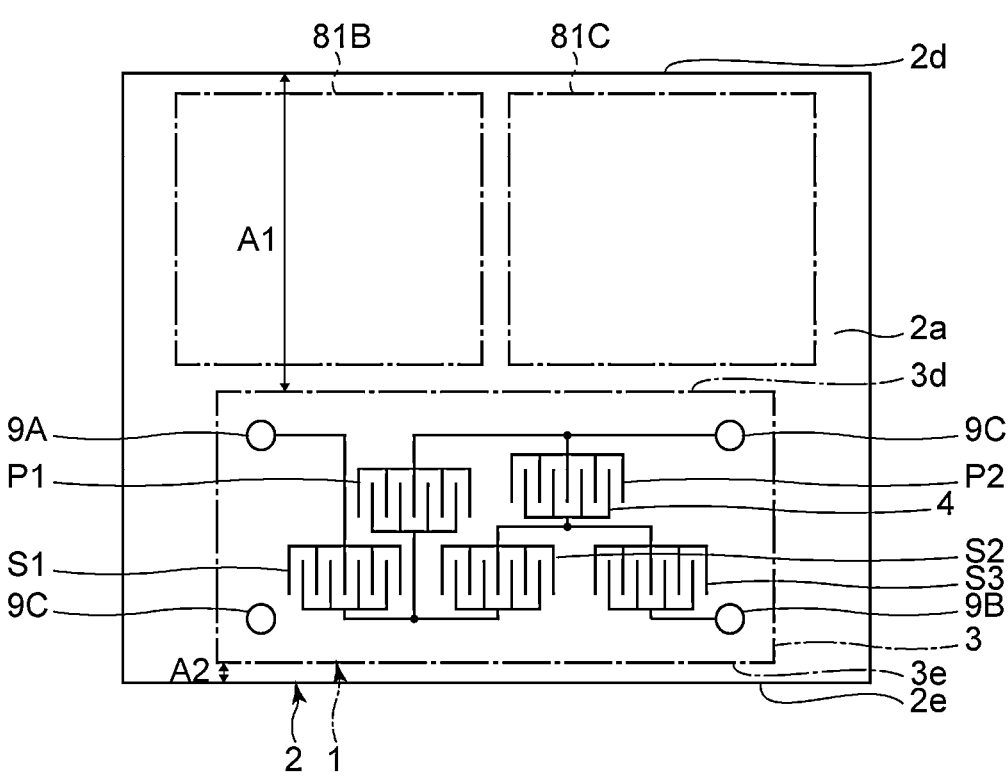
FIG. 16 is a schematic perspective plan view illustrating an electrode structure and the like of an acoustic wave device according to an eighth example embodiment of the present invention, the electrode structure being provided on a second main surface of a piezoelectric substrate.

FIG. 16 is a schematic perspective plan view illustrating an electrode structure and the like of an acoustic wave device according to the eighth example embodiment, the electrode structure being provided on a second main surface of a piezoelectric substrate. In FIG. 16, the electrode structure in the element chip 81B and the element chip 81C, which will be described later, is omitted.

The acoustic wave device in the present example embodiment includes an acoustic wave element chip 1, an element chip 81B, and an element chip 81C. Specifically, the acoustic wave element chip 1 having the similar configuration to that in the first example embodiment is mounted on the first main surface 2a of the package substrate 2. Further, the element chip 81B and the element chip 81C are mounted on the first main surface 2a. The acoustic wave element chip 1, the element chip 81B, and the element chip 81C are not electrically connected to each other. The acoustic wave element chip 1, the element chip 81B, and the element chip 81C are elements independent of each other.

The edge-side IDT electrode in the fifth to eighth example embodiments is the similar to the edge-side IDT electrode in the first example embodiment. The edge-side IDT electrode in the fifth to eighth example embodiments may be the similar to the edge-side IDT electrode in the second example embodiment or the third example embodiment. Even in these cases, it is possible to reduce or prevent the polarization inversion in the entire acoustic wave device.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a package substrate including a first main surface; and an acoustic wave element chip that is mounted on the first main surface of the package substrate and includes:

a piezoelectric layer including a second main surface and a third main surface that face each other; and a plurality of interdigital transducer (IDT) electrodes that are provided at the second main surface located on a first main surface side among the second main surface and the third main surface, each IDT electrode including a plurality of electrode fingers; wherein the first main surface of the package substrate includes a first side and a second side that face each other, the second main surface of the piezoelectric layer includes a first edge portion located closer to the first side among the first side and the second side and a second edge portion facing the first edge portion in a plan view, and a distance between the first side and the first edge portion is longer than a distance between the second side and the second edge portion in the plan view;

the piezoelectric layer has a Z-axis as a crystal axis, and the Z-axis is inclined with respect to a thickness direction of the piezoelectric layer so as to be directed toward a first edge portion side as the Z-axis is directed from the third main surface toward the second main surface of the piezoelectric layer;

when the IDT electrode is viewed from a direction perpendicular to a direction in which the plurality of electrode fingers extend, a region in which the electrode fingers adjacent to each other overlap each other is an intersection region, and a dimension of the intersection region along the direction in which the plurality of electrode fingers extend is an intersection width; and when an IDT electrode at a position closest to the first edge portion among the plurality of IDT electrodes is set as an edge-side IDT electrode, a product of the intersection width and a number of pairs of the plurality of electrode fingers of the edge-side IDT electrode is smallest among products of the intersection width and the number of pairs of the plurality of electrode fingers of the plurality of respective IDT electrodes.

2. The acoustic wave device according to claim 1, wherein the second main surface of the piezoelectric layer is bonded to the first main surface of the package substrate by a plurality of bumps;

the second main surface of the piezoelectric layer is connected to each of the first edge portion and the second edge portion, and includes a third edge portion and a fourth edge portion that face each other;

the plurality of bumps are provided along each of the first to fourth edge portions, and a pitch between the plurality of bumps provided along the first edge portion is shorter than a pitch between the plurality of bumps provided along each of the third edge portion and the fourth edge portion; and the edge-side IDT electrode is positioned such that at least a portion of the edge-side IDT electrode is sandwiched between two bumps among the plurality of bumps provided along the first edge portion.

3. The acoustic wave device according to claim 1, wherein the second main surface of the piezoelectric layer is bonded to the first main surface of the package substrate by a plurality of Au bumps.

4. The acoustic wave device according to claim 1, wherein the piezoelectric layer includes a side surface connected to the second main surface and the third main surface; and the acoustic wave device further comprises a sealing resin layer that is provided on the package substrate to cover at least the side surface of the piezoelectric layer.

5. The acoustic wave device according to claim 1, further comprising:

a support substrate; wherein the support substrate and the piezoelectric layer are stacked, and, among the second main surface and the third main surface of the piezoelectric layer, the third main surface is located on a support substrate side.

6. The acoustic wave device according to claim 1, wherein the piezoelectric layer includes lithium niobate or lithium tantalate.

7. The acoustic wave device according to claim 1, wherein a plurality of element chips are mounted on the first main surface of the package substrate, and at least one of the plurality of element chips is the acoustic wave element chip.

8. The acoustic wave device according to claim 7, wherein the acoustic wave device is a duplexer; and two element chips of the plurality of element chips are mounted on the first main surface of the package substrate, one element chip is a reception filter, another element chip is a transmission filter, and at least one of the two element chips is the acoustic wave element chip.

9. The acoustic wave device according to claim 7, wherein the acoustic wave device is a multiplexer; and three or more element chips of the plurality of element chips that are each a band-pass filter are mounted on the first main surface of the package substrate, and at least one of the three or more element chips is the acoustic wave element chip.

10. An acoustic wave device comprising:

a package substrate including a first main surface; and an acoustic wave element chip that is mounted on the first main surface of the package substrate and includes:

a piezoelectric layer including a second main surface and a third main surface that face each other; and a plurality of interdigital transducer (IDT) IDT electrodes that are provided at the second main surface located on a first main surface side among the second main surface and the third main surface, each IDT electrode including a plurality of electrode fingers; wherein a series arm resonator and a plurality of parallel arm resonators, each including the IDT electrode, are provided on the second main surface of the piezoelectric layer;

the first main surface of the package substrate includes a first side and a second side that face each other, the second main surface of the piezoelectric layer includes a first edge portion located closer to the first side among the first side and the second side and a second edge portion facing the first edge portion in a plan view, and a distance between the first side and the first edge portion is longer than a distance between the second side and the second edge portion in the plan view;

the piezoelectric layer has a Z-axis as a crystal axis, and the Z-axis is inclined with respect to a thickness direction of the piezoelectric layer so as to be directed toward a first edge portion side as the Z-axis is directed from the third main surface toward the second main surface of the piezoelectric layer; and when an IDT electrode at a position closest to the first edge portion among the plurality of IDT electrodes is set as an edge-side IDT electrode, the IDT electrode of a parallel arm resonator at a position closest to an input end side among the plurality of parallel arm resonators is the edge-side IDT electrode.

11. The acoustic wave device according to claim 10, wherein the second main surface of the piezoelectric layer is bonded to the first main surface of the package substrate by a plurality of bumps;

the second main surface of the piezoelectric layer is connected to each of the first edge portion and the second edge portion, and includes a third edge portion and a fourth edge portion that face each other;

the plurality of bumps are provided along each of the first to fourth edge portions, and a pitch between the plurality of bumps provided along the first edge portion is shorter than a pitch between the plurality of bumps provided along each of the third edge portion and the fourth edge portion; and the edge-side IDT electrode is positioned such that at least a portion of the edge-side IDT electrode is sandwiched between two bumps among the plurality of bumps provided along the first edge portion.

12. The acoustic wave device according to claim 10, wherein the second main surface of the piezoelectric layer is bonded to the first main surface of the package substrate by a plurality of Au bumps.

13. The acoustic wave device according to claim 10, wherein the piezoelectric layer includes a side surface connected to the second main surface and the third main surface; and the acoustic wave device further comprises a sealing resin layer that is provided on the package substrate to cover at least the side surface of the piezoelectric layer.

14. The acoustic wave device according to claim 10, further comprising:

a support substrate; wherein the support substrate and the piezoelectric layer are stacked, and, among the second main surface and the third main surface of the piezoelectric layer, the third main surface is located on a support substrate side.

15. The acoustic wave device according to claim 10, wherein the piezoelectric layer includes lithium niobate or lithium tantalate.

16. The acoustic wave device according to claim 10, wherein a plurality of element chips are mounted on the first main surface of the package substrate, and at least one of the plurality of element chips is the acoustic wave element chip.

17. The acoustic wave device according to claim 16, wherein the acoustic wave device is a duplexer; and two element chips of the plurality of element chips are mounted on the first main surface of the package substrate, one element chip is a reception filter, another element chip is a transmission filter, and at least one of the two element chips is the acoustic wave element chip.

18. The acoustic wave device according to claim 16, wherein the acoustic wave device is a multiplexer; and three or more element chips of the plurality of element chips that are each a band-pass filter are mounted on the first main surface of the package substrate, and at least one of the three or more element chips is the acoustic wave element chip.

19. An acoustic wave device comprising:

a package substrate including a first main surface; and an acoustic wave element chip that is mounted on the first main surface of the package substrate and includes:

a piezoelectric layer including a second main surface and a third main surface that face each other; and a plurality of interdigital transducer (IDT) electrodes that are provided at the second main surface located on a first main surface side among the second main surface and the third main surface, each IDT electrode including a plurality of electrode fingers; wherein a plurality of surface acoustic wave resonators, each including the IDT electrode, are provided on the second main surface of the piezoelectric layer, and the plurality of surface acoustic wave resonators include a series arm resonator and a plurality of parallel arm resonators;

the first main surface of the package substrate includes a first side and a second side that face each other, the second main surface of the piezoelectric layer includes a first edge portion located closer to the first side among the first side and the second side and a second edge portion facing the first edge portion in a plan view, and a distance between the first side and the first edge portion is longer than a distance between the second side and the second edge portion in the plan view;

the piezoelectric layer has a Z-axis as a crystal axis, and the Z-axis is inclined with respect to a thickness direction of the piezoelectric layer so as to be directed toward a first edge portion side as the Z-axis is directed from the third main surface toward the second main surface of the piezoelectric layer;

when the IDT electrode is viewed from a direction perpendicular to a direction in which the plurality of electrode fingers extend, a region in which the electrode fingers adjacent to each other overlap each other is an intersection region, and a dimension of the intersection region along the direction in which the plurality of electrode fingers extend is an intersection width; and when an IDT electrode at a position closest to the first edge portion among the plurality of IDT electrodes is set as an edge-side IDT electrode, the IDT electrode of the parallel arm resonator that is not split in series is the edge-side IDT electrode, and a product of the intersection width and a number of pairs of the plurality of electrode fingers of the edge-side IDT electrode is smaller than a product of the intersection width and the number of pairs of the plurality of electrode fingers of the IDT electrode in at least one surface acoustic wave resonator among the surface acoustic wave resonators at a position closest to an input end side.

20. The acoustic wave device according to claim 19, wherein the second main surface of the piezoelectric layer is bonded to the first main surface of the package substrate by a plurality of bumps;

the second main surface of the piezoelectric layer is connected to each of the first edge portion and the second edge portion, and includes a third edge portion and a fourth edge portion that face each other;

the plurality of bumps are provided along each of the first to fourth edge portions, and a pitch between the plurality of bumps provided along the first edge portion is shorter than a pitch between the plurality of bumps provided along each of the third edge portion and the fourth edge portion; and the edge-side IDT electrode is positioned such that at least a portion of the edge-side IDT electrode is sandwiched between two bumps among the plurality of bumps provided along the first edge portion.

* * * * *